United States Patent [19]

Marks et al.

[11] Patent Number: 5,387,120
[45] Date of Patent: Feb. 7, 1995

[54] LATCHING IC CONNECTOR

[75] Inventors: Richard L. Marks; Donald W. Milbrand, Jr., both of Mechanicsburg, Pa.

[73] Assignee: Wells Electronics, Inc., South Bend, Ind.

[21] Appl. No.: 19,552

[22] Filed: Feb. 19, 1993

[51] Int. Cl.[6] .......................................... H01R 13/62
[52] U.S. Cl. .......................................... 439/331; 439/73
[58] Field of Search ........................ 439/68, 70–73, 439/330, 331, 525, 526

[56] References Cited

U.S. PATENT DOCUMENTS

| | | |
|---|---|---|
| 4,758,176 | 7/1988 | Abe et al. ........................... 439/72 X |
| 5,009,608 | 4/1991 | Shipe ................................. 439/331 |
| 5,044,810 | 9/1991 | Matsuoka et al. ................. 439/331 X |
| 5,100,332 | 3/1992 | Egawa ............................. 439/331 X |
| 5,120,238 | 6/1992 | Marks et al. ....................... 439/331 |
| 5,176,524 | 1/1993 | Mizuno et al. .................... 439/72 X |

Primary Examiner—Khiem Nguyen
Attorney, Agent, or Firm—James D. Hall

[57] ABSTRACT

A connector for an integrated circuit (IC) chip to secure the IC chip during testing. The connector includes a unique latching system with a pivotal contact pad carried beneath a latch plate for self-adjusting alignment prior to engaging the leads of the IC chip. The latching system also includes an actuator and hook member pivotally connected to the latch plate in an over center movement fashion to increase the clamping force uniformly across IC leads.

15 Claims, 5 Drawing Sheets

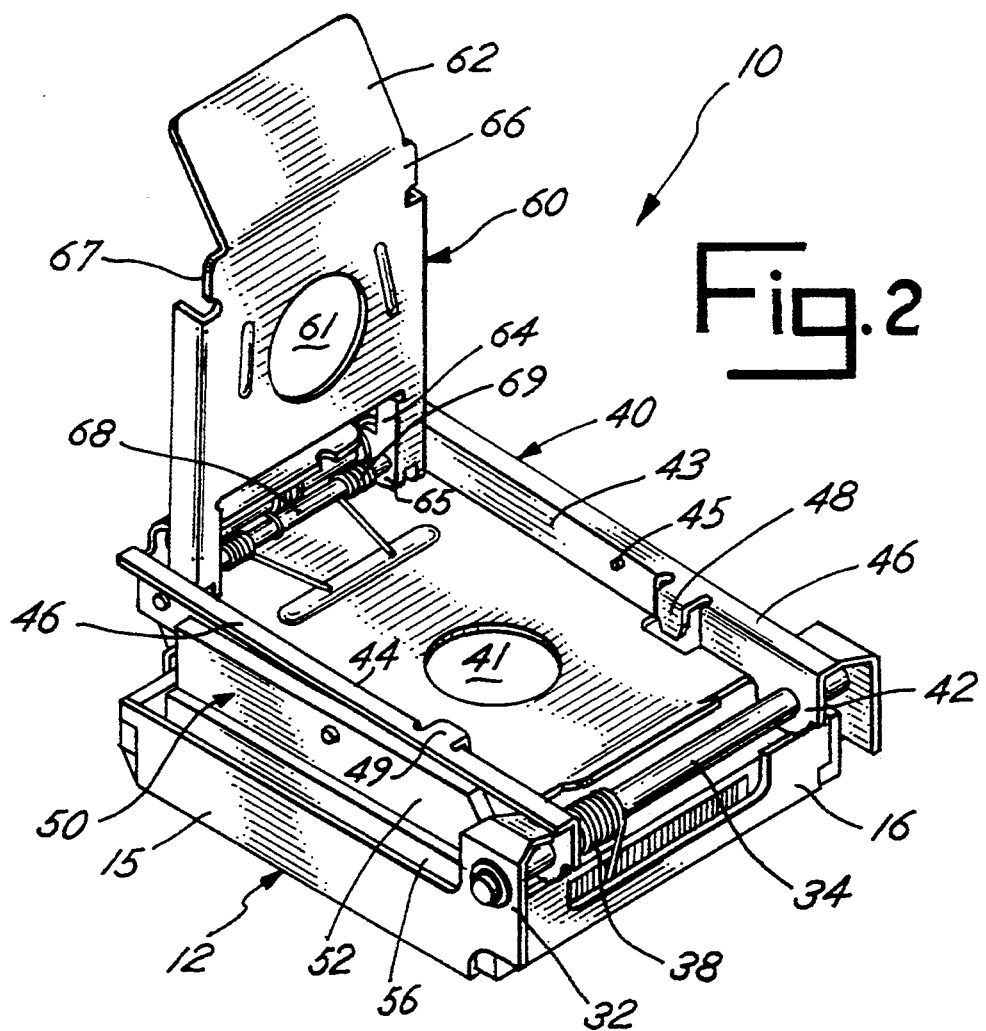
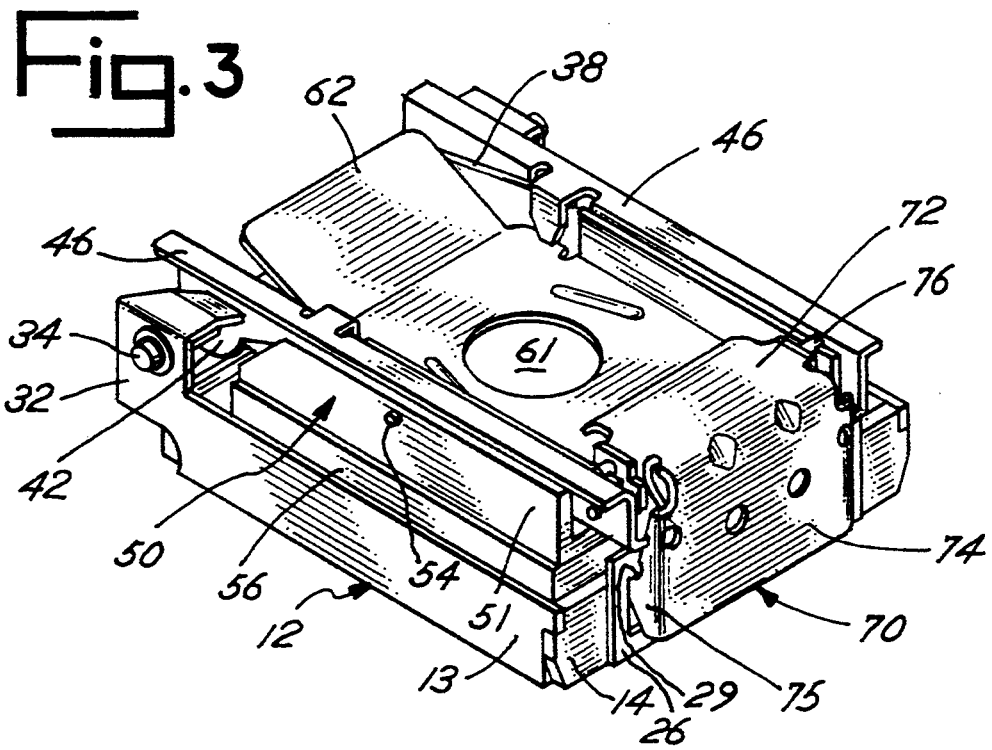

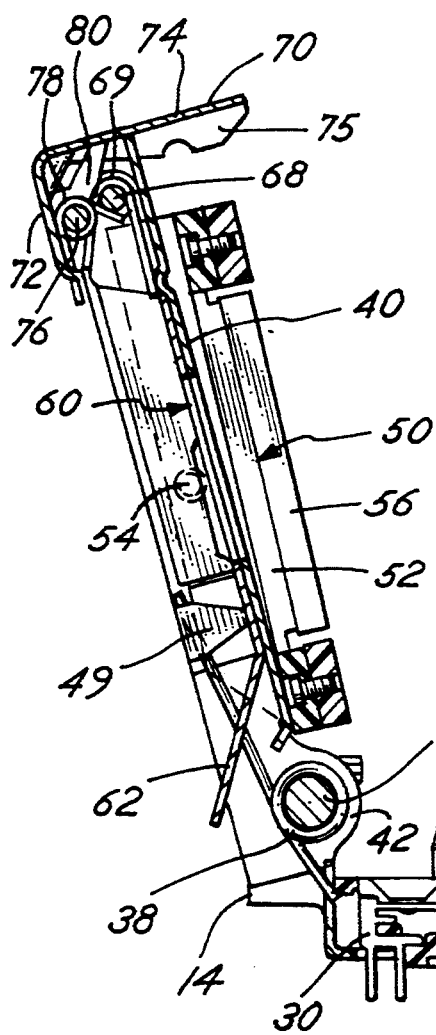
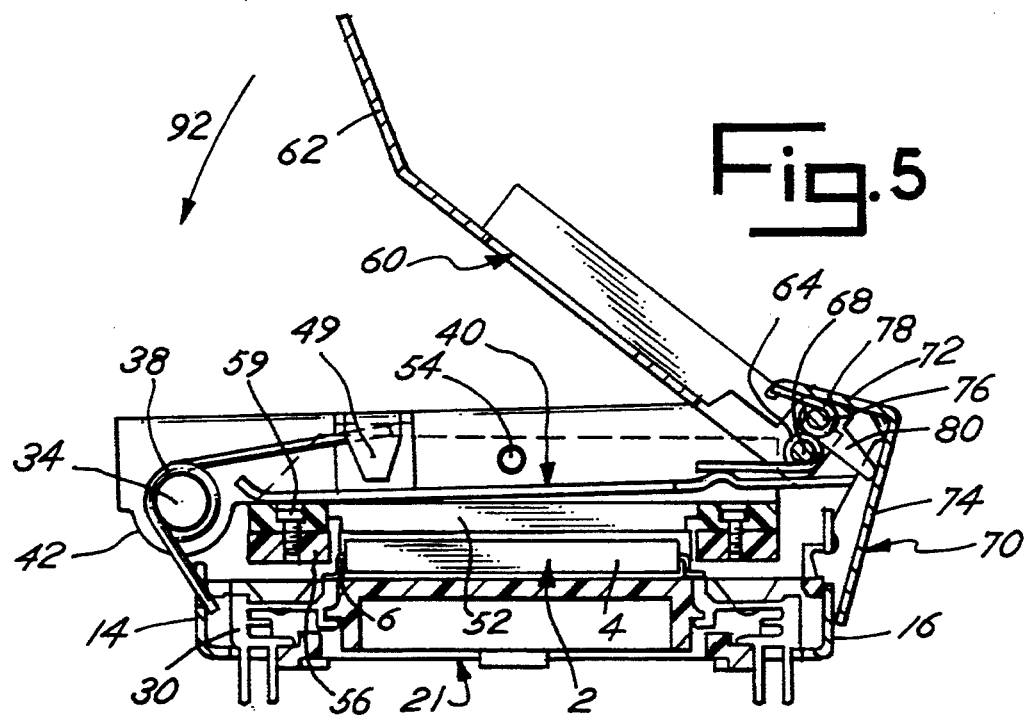
Fig. 4
Fig. 5

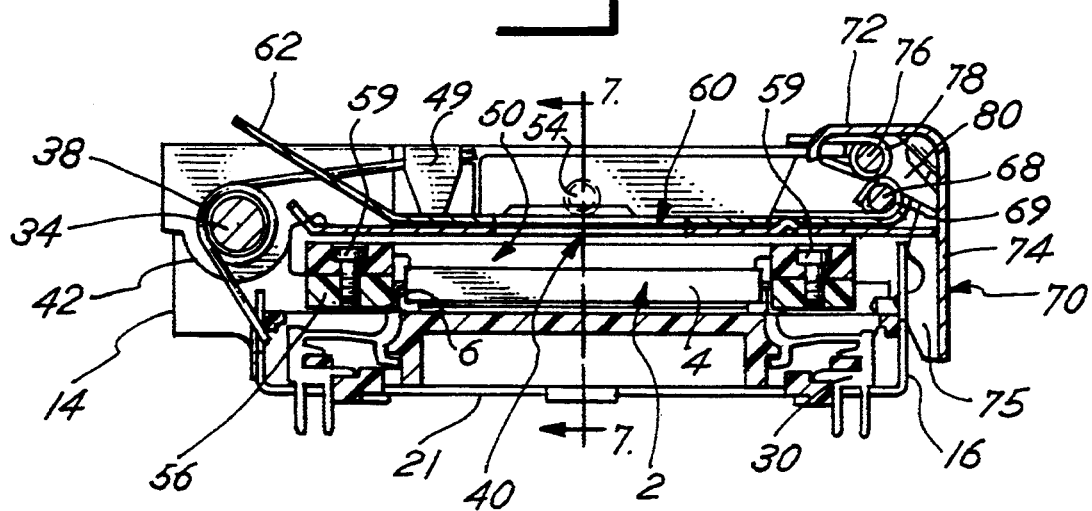
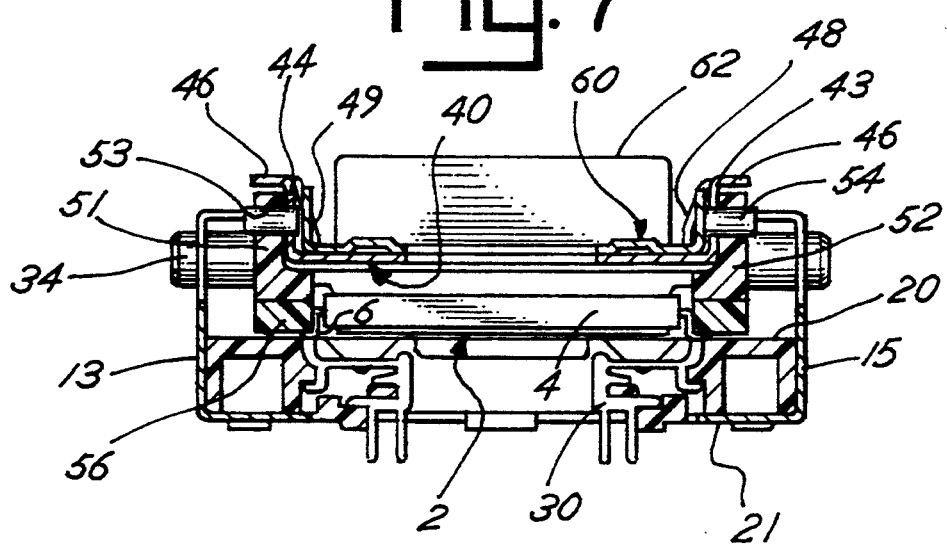

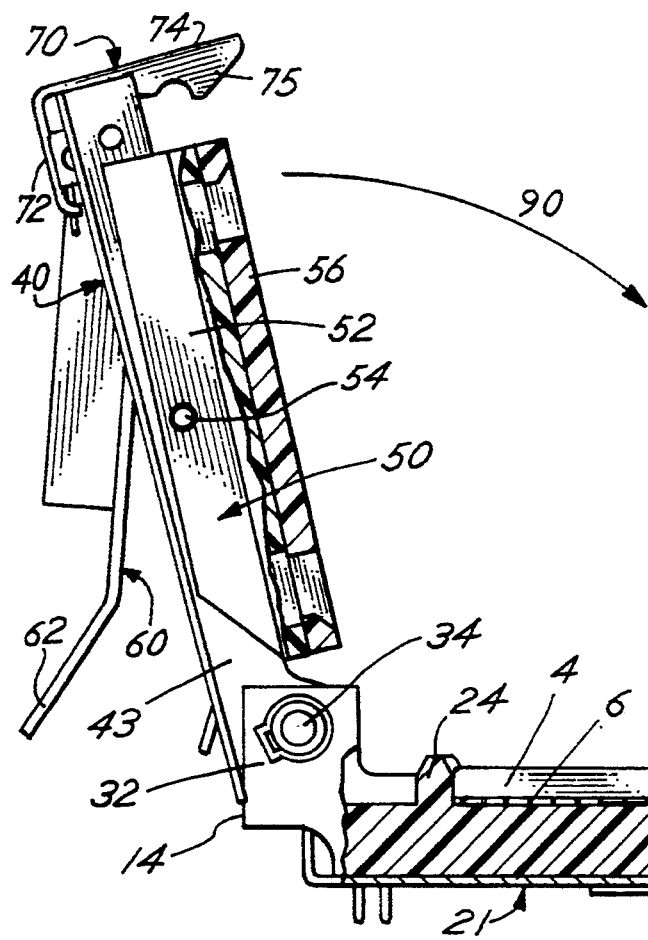
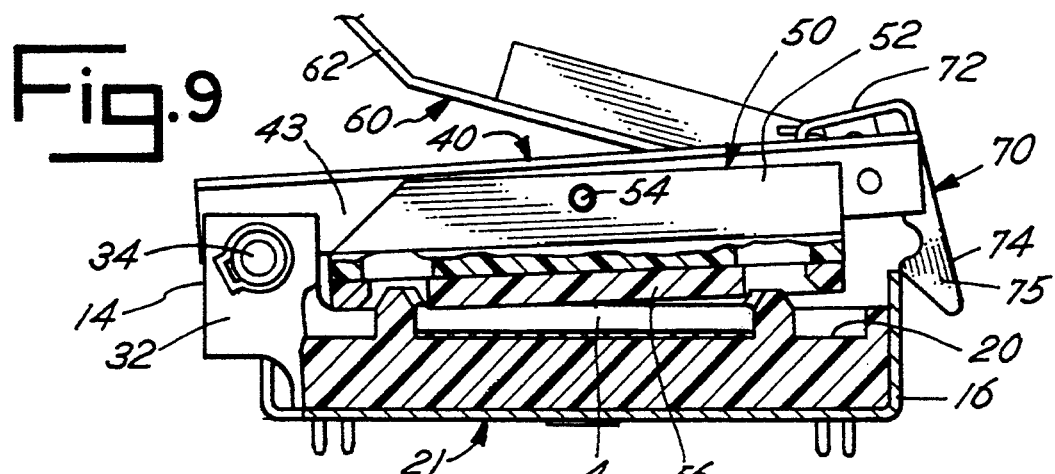
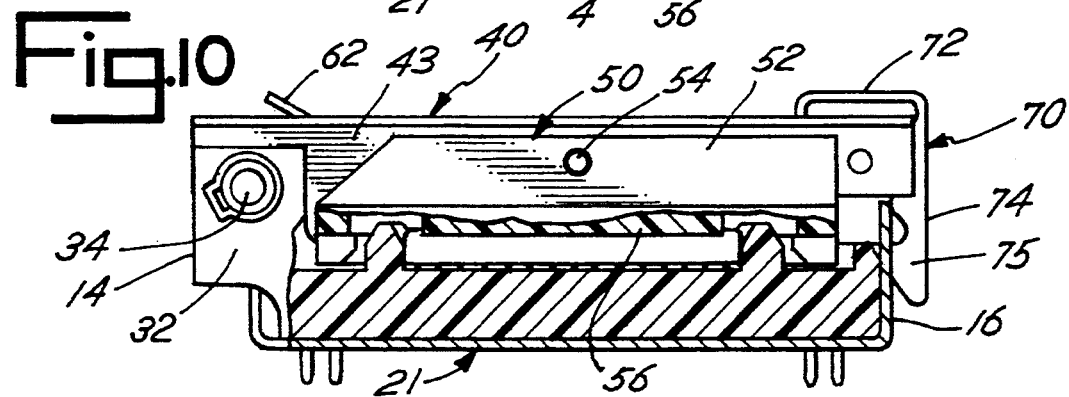

LATCHING IC CONNECTOR

This invention relates to integrated circuit (IC) chip connectors and will have application to a latching IC connector.

BACKGROUND OF THE INVENTION

IC chip carriers and connectors typically house IC chips during burn-in testing. For certain types of IC chips, the connector must firmly and positively lock the IC chip package in place by an external mechanism. One example of a prior IC chip connector is shown in U.S. Pat. No. 5,120,238, which is incorporated herein by reference. The device shown in the 5,120,238 patent includes a latch plate pivotally connected to an end of the connector and a hook part pivotally connected to an opposite end of the cover or latch plate. An actuator is pivotally connected to the latch plate adjacent the hook part for locking contact with the connector body, which secure the IC chip package and carrier within the connector. The plate-actuator-hook connection allows the connector to be opened and closed with one hand, since the force transmitted to the hook part is significantly increased from the force applied to the actuator. The latch plate is rotated about the pivot into a lateral position to serve the chip package to the body. Integral contact pads of the latch plate press the IC leads against the resilient contacts to ensure electrical connection between the IC leads and the contacts.

In this type of connector structure, the lateral row of IC leads arranged close to the pivot is pressed at first by the pad disposed close to the pivot and the opposite lateral row of IC leads arranged away from the pivot is then pressed by the pad disposed away from the pivot. In other words, it is difficult to carry out simultaneous pressing of all IC leads against the resilient contacts. With a deviation load exerted on the lateral row of IC leads arranged close to the pivot, there is a fair possibility of deformation of the IC leads. Furthermore, since the IC leads in longitudinal rows are successively pressed by the pads from the side close to the pivot, deviation force will be applied to the IC leads in the width direction. This may possibly cause deformation of the IC leads and lateral displacement of the IC package.

SUMMARY OF THE INVENTION

The IC connector of this invention eliminates the above described contact deformation problems by using a contact pad carried by a pivotal frame mounted to the cover latch plate. The contact pad frame carries the contact pad, which engages the IC leads. The pivotal connection between the latch plate and contact pad frame allows the contact pad to properly seat and uniformly engage the IC leads as the cover plate closes over the IC package body. The connector body also includes alignment posts which to initialize alignment of the frame before the contact pad engages the IC leads.

Accordingly, it is an object of this invention to provide an IC connector which includes a self adjusting contact pad frame for uniformly engaging the leads of an IC package.

Another object is to provide an IC connector, which includes alignment means for engaging a contact pad to align the contact pad before it engages the leads of an IC package.

Another object is to provide for an IC connector, which may be latched and unlatched with one hand.

Another object is to provide for an IC connector, which heightens the clamping force on the IC package from the force imparted to the latch actuator.

BRIEF DESCRIPTION OF THE DRAWINGS

A preferred embodiment of the invention has been depicted for illustrative purpose wherein:

FIG. 2 is a perspective view of the IC connector with the package inserted and the latch in a partially closed position.

FIG. 3 is a perspective view similar to FIG. 2, but showing the latch in a fully closed position.

FIG. 4 is a sectional view of the connector with the latch in a full open position taken along line 4—4 of FIG. 1.

FIG. 5 is a sectional view of the connector with the latch in a partially closed position.

FIG. 6 is a sectional view of the connector with the latch in a fully closed position.

FIG. 7 is a front sectional view taken along line 7—7 of FIG. 6.

FIG. 8 is a sectional view of the connector with the latch in a full open position taken along line 8—8 of FIG. 1.

FIG. 9 is a sectional view of the connector similar to FIG. 8 with the latch in a partially closed position.

FIG. 10 is a sectional view of the connector similar to FIG. 8 with the latch in a fully closed position.

DESCRIPTION OF THE PREFERRED EMBODIMENT

Figure 1:
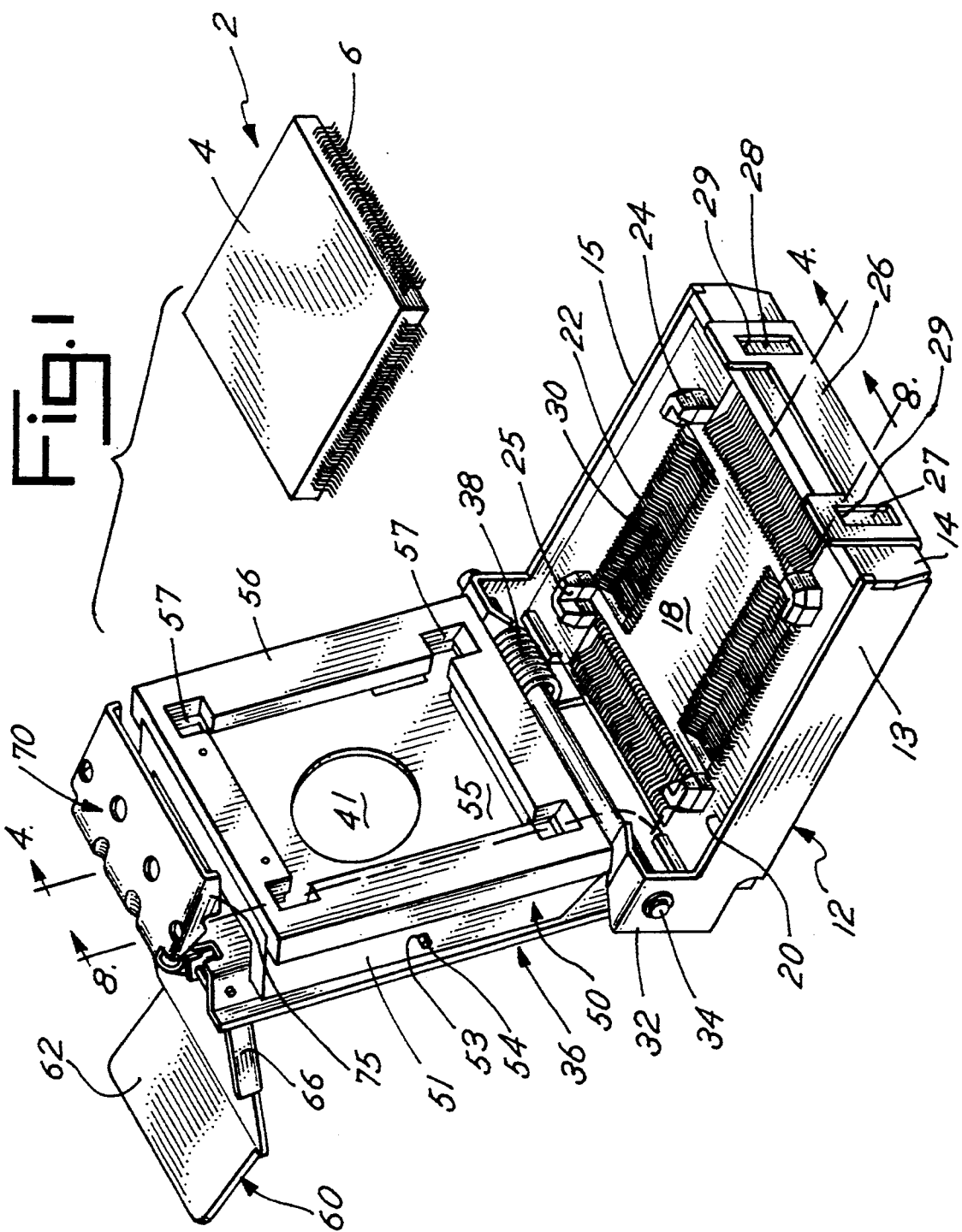
FIG. 1 is a perspective view of the IC connector of this invention with an IC package shown just prior to insertion.

The preferred embodiment herein disclosed is not intended to be exhaustive or to limit the application to the precise forms disclosed. Rather it is chosen and described in order that others skilled in the art might utilize its teachings.

The drawings show the IC chip connector 10 of this invention. IC chip connector 10 shown in the drawings, which for illustrative purposes, is shown as a typical leaded IC chip 2 with a carrier package. The connector of this invention is not limited to any type or configuration of IC chip, whether leaded or leadless. The connector of this invention can also be used with conventional carrier packages as described in U.S. Pat. No. 4,435,724, incorporated herein by reference.

Connector 10 includes a body 12, which includes side walls 13, 15, and end walls 14, 16. Walls 13, 14, 15, and 16 form a top face 20 about a central opening 18. Alignment posts 24 extend upwardly from top face 20 at each corner of central opening 18. Each alignment post 24 has a vertical recess 25 for accepting the corners of IC chip 2. Body 12 defines grooves 22 located peripherally of center opening 18 as shown to accommodate leads 6 of chip 2. Electrically conductive contacts 30 are fitted in grooves 22 and extend below the bottom surface 21 of body 12 for electrical connection to a PC board (not shown). Contacts 30 also extend partially upward through top face 20. Leads 6 and contacts 30 are in electrical contact when IC chip 2 is secured to connector 10 during proper testing conditions.

It should be noted that the configuration of IC chip 2 and the orientation of grooves 22 will depend on the configuration and number of leads of IC chip 2. The configuration and orientation illustrated does not limit the invention to those designs but is shown for purpose of description only.

End wall 14 of connector 10 includes a catch plate 26, which defines spaced slots 27, 28. Each slot 27, 28 defines an upper lip 29. Opposite end wall 16 of connector 10 includes raised tabs 32. A rod 34 extends through tabs 32 and is secured stationary relative to connector 10.

Latching mechanism 36 shown in FIGS. 1-3 includes latch plate 40, which has ears 42. Rod 34 extends through ears 42 as shown in FIG. 2 to rotationally secure latch plate 40 to body 12. Helical spring 38 circumscribes rods 34 and serves to urge latch plate 40 towards the latched position (FIG. 3). Latch plate 40 has a vent hole 41, which is aligned with connector center opening 18 when latch plate 40 is in a latched position (FIG. 3). Latch plate 40 also includes raised side walls 43, 44 and top lips 46, 47. As shown in FIG. 4, each lip 46, 47 includes an opposed extension 48, 49, which projects towards the center of latch plate 40 with an end of spring 38 housed in the space between the extension 49 and side wall 43. Raised side walls 43, 44 also include a centrally positioned through bore 45.

Latch plate 40 also pivotally supports contact pad frame 50. Contact frame 50 is preferably constructed of a durable metal, such as aluminum. Contact frame 50 has a generally rectangular configuration with two raised opposite side walls 51, 52. Each raised side wall 51 and 52 has a centrally positioned through bore 53. Contact frame is pivotally mounted to latch plate 40 by pivot pins 54 fitted within aligned bores 43 and 53 in latch plate 40 and contact frame 50. Contact frame 50 pivots relative to latch plate 40 about a lateral axis through contact pins 54. Contact frame 50 carries a contact pad 56. Contact pad 56 is constructed of a nonconductive semi-malleable material such as plastic. Contact pad 56 provides a relatively malleable surface for urging IC chip leads 6 against contacts 30 without damaging either the leads or contacts. Contact pad 56 is secured to contact frame 50 by any conventional method, such as by screws 59. Contact frame 50 and pad 56 define a central opening 55 for accommodating IC chip body 4 in an overlying relation. Contact frame 50 and pad 56 also define apertures 57 in each corner to accommodate alignment posts 24 of IC chip body 4.

A rod 68 is connected between and spans latch plate walls 43, 44. Actuator plate 60 is rotatably connected to rod 68 as shown in FIG. 2. Actuator plate 60, as best shown in FIG. 2, includes legs 64, which have feet 65. Rod 68 extends through feet 65. Actuator plate also includes oppositely located side flanges 66, 67, which bear against extensions 48, 49 to secure actuator plate 60 and latch plate 40 in the latched position of FIG. 3. Actuator plate 60 also includes inclined handle part 62 to facilitate use and a vent hole 61, which is aligned with vent hole 41 of latch plate 40. Springs 69 urge actuator plate 60 toward the unlatched position of FIG. 1.

Latch hook member 70 is rotatably connected to actuator plate 60 through a rod 76 which spans actuator feet 65 and is secured thereto by retainer ring 77 (not shown). Hook member 70 includes a one-piece upper portion 72, which overlies rod 76 and a depending lower hook portion 74, which includes peripheral hooks 75. Spring 78 is connected to rod 76 and bears on rod 68 to bias hook member 70 in a latched position.

As actuator plate 60 rotates about rod 68, projection 80 of hook member 70 contacts latch plate 40, which serves to urge hook part 70 into an unlatched or loading position as shown in FIG. 5.

FIGS. 4-8 illustrate the operation of connector 10 through a series of sectional views. FIG. 4 illustrates the connector 10 with latching mechanism 36 in a full open position, which allows the IC chip 2 to be placed in the connector such that IC leads 6 overlie and engage contacts 30 as shown. Latching mechanism 36 is then pivoted as shown in FIGS. 4-10 to secure the IC chip 2 for testing.

Normally, connector 10 will be secured to a PC board (not shown) before latching mechanism 36 is closed. This will allow one handed operation of the latching mechanism 36. In FIGS. 4 and 8, a user (not shown) grasps actuator handle 62 and pushes or pulls in the direction of arrow 90. This action causes latch plate 40 to pivot about rod 34. As latch plate 40 moves downward over IC chip 2, contact pad 56 is positioned to engage leads 6 of IC chip 2. The pivoting action of contact frame 50 allows for uniform alignment of pads 56 over the IC leads 6 as latch plate 40 is lowered. This allows substantially all of the leads 6 to be pressed at the same time to ensure uniform locking engagement with contacts 30. As hook member 70 is lowered, the projection 80 of hook member 70 contacts latch plate 40 urging the hooks 75 to position in slots 27, 28 of catch plate 26.

As shown in FIG. 5, actuator plate 60 is then pivoted about rod 68 to properly position hook part 70. The user then pulls or pushes actuator handle 62 in the direction of arrow 92 (FIG. 5). This action pulls rod 76 and its connected hook part forward, towards rod 34 and over the center axis of the rod 76. This over-center pivoting creates a moment, which is related to the ratio of the distance between the centerline of rod 76 to the end of actuator plate 60 over the diminishing angle. As the user continues to pivot actuator plate 60, the actuator is secured in a snap-fit manner between side wall 43, 44 by extensions 49, 48 (FIGS. 6, 7 and 10). Due to the over-center arrangement of rods 34, 68 and 76, a user need exert only a few ounces of force on actuator 60 to exert a clamping force of about 75 pounds on IC chip 2. The force is evenly distributed through contact pad 56 to leads 6 of IC package 2 and contacts 30.

To disengage latch mechanism 36, the reverse of the above procedure is followed. With the latch plate 40 in the locked position of FIGS. 6, 7 and 10, the user pulls up on actuator plate handle 62. This causes rod 76 to shift away from rod 34 urging rod 76 over the center axis of rod 68. Projection 80 then rides on latch plate 40 forcing hook part 70 to move away from rod 34. When hook portion 75 disengages from slots 27, 28 the latching mechanism 36 may be pivoted into the open position. The IC package 2 may then be removed from connector 10 and an IC package inserted for IC testing.

It should be understood that the invention is not to be limited to the precise form disclosed but may be modified within the scope of the appended claims.

What I claim is:

1. A connector for housing an integrated circuit, said integrated circuit including a body and a plurality of leads extending outwardly of said body, said connector comprising:

a base defining a central cavity means for accommodating said integrated circuit;

a plurality of resilient electrically conductive contacts housed within said base;

latching means pivotally connected to said base between a latched position and an unlatched position for securing said integrated circuit to said base;

press means pivotally attached to said latching means for uniformly urging said leads against said contacts; and means for aligning said press means with said leads, prior to said press means contacting said leads.

2. The connector of claim 1 wherein said press means includes a frame pivotally mounted to said latching means, and a pad for engaging said leads when the latching means is in the latched position.

3. The connector of claim 2 wherein said latching means includes a latch plate pivotally connected to said base at one end thereof and shiftable between said latched position overlying said integrated circuit and said unlatched position spaced from said connector, an actuator plate pivotally connected at one end thereof to said latch plate opposite said latch plate one end, an actuator plate and a hook part pivotally connected to said actuator plate adjacent said actuator plate one end, said actuator plate and said hook part shiftable between latched and unlatched positions, and first biasing means connected to said hook part for continually urging the hook part towards said unlatched position.

4. The connector of claim 2 and means carried by said base for aligning said press means with said leads prior to engaging said leads.

5. The connector of claim 4 wherein said press means defines a cavity having an inner peripheral alignment edge, said means for aligning includes a post extending vertically from said base, said post positioned adjacent to said cavity and in alignment with said alignment edge to position said pad in alignment with said leads as the latching means is pivoted towards said latched position.

6. The connector of claim 3 wherein said latch plate adjacently overlies and secures said integrated circuit body when said actuator plate and said latch plate are in their said latched positions, said hook part moving correlatively with the actuator plate and constituting clamp means for contacting said base to secure the actuator plate in its said latched position.

7. The connector of claim 6 wherein said hook part includes a rod spanning said actuator plate transverse to a direction of pivoting movement, the actuator plate including a rod spanning said latch plate and positioned adjacent to and substantially parallel with said hook part rod, wherein pivoting of the actuator plate towards its said latch position causes said actuator plate rod to slide towards the hook part rod while bearing on the latch plate, and simultaneously draws the hook part rod over a central axis of the actuator rod to increase clamping force on the hook part.

8. The connector of claim 6 and second biasing means connected to said actuator plate for urging the actuator plate towards its unlatched position, and means connected to said latch plate for securing the actuator plate and said hook part in their said latched positions.

9. The connector of claim 8 and third biasing means connected to said latch plate for urging the latch plate towards its said unlatched position.

10. The connector of claim 4 said press means defines a cavity means having inner peripheral alignment edges, wherein said means for aligning includes first and second posts connected to said base adjacent said cavity means, said post aligned with said alignment edges as the latching means is pivoted into the latched position.

11. The connector of claim 10 wherein said press means cavity is generally rectangular and said posts are aligned with opposite first and second corners of said alignment edges as the latching means is pivoted into the latched position.

12. The connector of claim 11 and third and fourth posts connected to said base and aligned with third and fourth opposite corners of said alignment edges.

13. The connector of claim 1, wherein said aligning means comprises at least one guide post attached to and extending from one of said press means and said base, and at least one corresponding opening in an other of said press means and said base, said guide post extending freely into said opening in a longitudinal dimension thereof, when said latching means is in said latched position.

14. A connector for housing an integrated circuit, said integrated circuit including a body and a plurality of leads extending outwardly of said body, said connector comprising:

a base defining a central cavity means for accommodating said integrated circuit;

a plurality of resilient electrically conductive contacts housed within said base;

latching means pivotally connected to said base between a latched position and an unlatched position for securing said integrated circuit to said base; and press means pivotally attached to said latching means for uniformly urging said leads against said contacts;

wherein one of said press means and said base includes at least one guide post attached to and extending therefrom, and an other of said press means and said base includes at least one corresponding opening therein, each said guide post extending freely into a respective said opening in a longitudinal dimension.

15. A connector for housing an integrated circuit, said integrated circuit including a body and a plurality of leads extending outwardly of said body, said connector comprising:

a base defining a central cavity means for accommodating said integrated circuit;

a plurality of resilient electrically conductive contacts housed within said base;

latching means pivotally attached to said base at one edge thereof and movable between a latched position and an unlatched position for securing said integrated circuit to said base, said latching means including an actuator plate and a hook part pivotally connected to said actuator plate adjacent said actuator plate one end, said actuator plate and said hook part shiftable between latched and unlatched positions, and first biasing means connected to said hook part for continually urging the hook part towards said unlatched position; and press means pivotally attached to said latching means and having an absence of a direct attachment to said base, said press means for uniformly urging said leads against said contacts, said press means including a pad for engaging said leads when the latching means is in the latched position.

* * * * *